United States Patent
Chen et al.

(10) Patent No.: US 8,860,507 B2
(45) Date of Patent: Oct. 14, 2014

(54) AMPLIFIER WITH GAIN CIRCUIT COUPELD TO PRIMARY COIL OF TRANSFORMER

(75) Inventors: Hsien-Ku Chen, Taoyuan County (TW); Chia-Jun Chang, Taipei (TW); Ka-Un Chan, Hsinchu County (TW); Ying-Hsi Lin, Hsin-Chu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 104 days.

(21) Appl. No.: 13/615,567

(22) Filed: Sep. 13, 2012

(65) Prior Publication Data

US 2014/0022018 A1  Jan. 23, 2014

(30) Foreign Application Priority Data

Jul. 18, 2012  (TW) ............................. 101125828 A

(51) Int. Cl.
*H03F 3/45* (2006.01)
(52) U.S. Cl.
CPC ........................ *H03F 3/45* (2013.01)
USPC ............................................ 330/252; 330/301
(58) Field of Classification Search
CPC ...................................... H03F 1/26; H03F 3/45
USPC .......................................... 330/252, 188, 261
See application file for complete search history.

(56) References Cited

U.S. PATENT DOCUMENTS

| | | | | |
|---|---|---|---|---|
| 2,843,683 | A * | 7/1958 | Lewis, Jr. .......................... | 330/76 |
| 7,603,091 | B2 * | 10/2009 | Shin ............................ | 455/193.1 |
| 8,229,367 | B2 * | 7/2012 | Chan et al. ....................... | 455/78 |

* cited by examiner

*Primary Examiner* — Robert Pascal
*Assistant Examiner* — Khiem Nguyen
(74) *Attorney, Agent, or Firm* — Winston Hsu; Scott Margo

(57) ABSTRACT

An amplifier includes a transformer and a first stage gain circuit. The transformer includes a primary coil and a secondary coil. The primary coil is utilized for receiving an input signal. The first stage gain circuit has a first input port, which is coupled to the primary coil. The first stage gain circuit is utilized for gaining the input signal so as to generate a first output.

8 Claims, 4 Drawing Sheets

AMPLIFIER WITH GAIN CIRCUIT COUPELD TO PRIMARY COIL OF TRANSFORMER

BACKGROUND OF THE INVENTION

1. Field of the Invention

The present invention relates to the field of wireless communication, and more particularly, to a low noise amplifier employed in a receiver.

2. Description of the Prior Art

In the wireless communication system, the receiver applies a gain to the wireless signal received by the antenna through the low noise amplifier (LNA), and accordingly provides the amplified wireless signal to the following demodulator for demodulation. The design of the low noise amplifier requires many considerations, especially the noise from the amplifier itself. If too much noise is introduced to the wireless signal in the process of amplifying the wireless signal, the demodulator would generate an erroneous demodulation result. That is, the low noise amplifier should be properly designed to have the noise figure as low as possible to ensure the correctness of the data transmitted. Besides, due to the trend of the minimization of the integrated circuit, the design of the low noise amplifier has to consider how to optimize the performance of the low noise amplifier in a limited circuit area. Therefore, how to design a low noise amplifier which has a smaller circuit area and is more resistive to noise interference becomes a topic of the wireless communication system.

SUMMARY OF THE INVENTION

Therefore, one purpose of the present invention is to provide a low noise amplifier with a smaller circuit area, which is achieved by integrating part of the elements in the amplifier. Additionally, another purpose of the present invention is to lower the noise introduced by the amplifier itself by employing the transformer at the input terminal, thereby achieving good noise suppression effect.

An embodiment of the present invention provides an amplifier, including a transformer and a first stage gain circuit. The transformer includes a primary coil and a secondary coil, and the primary coil is used to receive an input signal. The first stage gain circuit includes a first input port, and the first input port is coupled to the primary coil. Besides, the first stage gain circuit is used to apply a gain to the input signal to provide a first output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
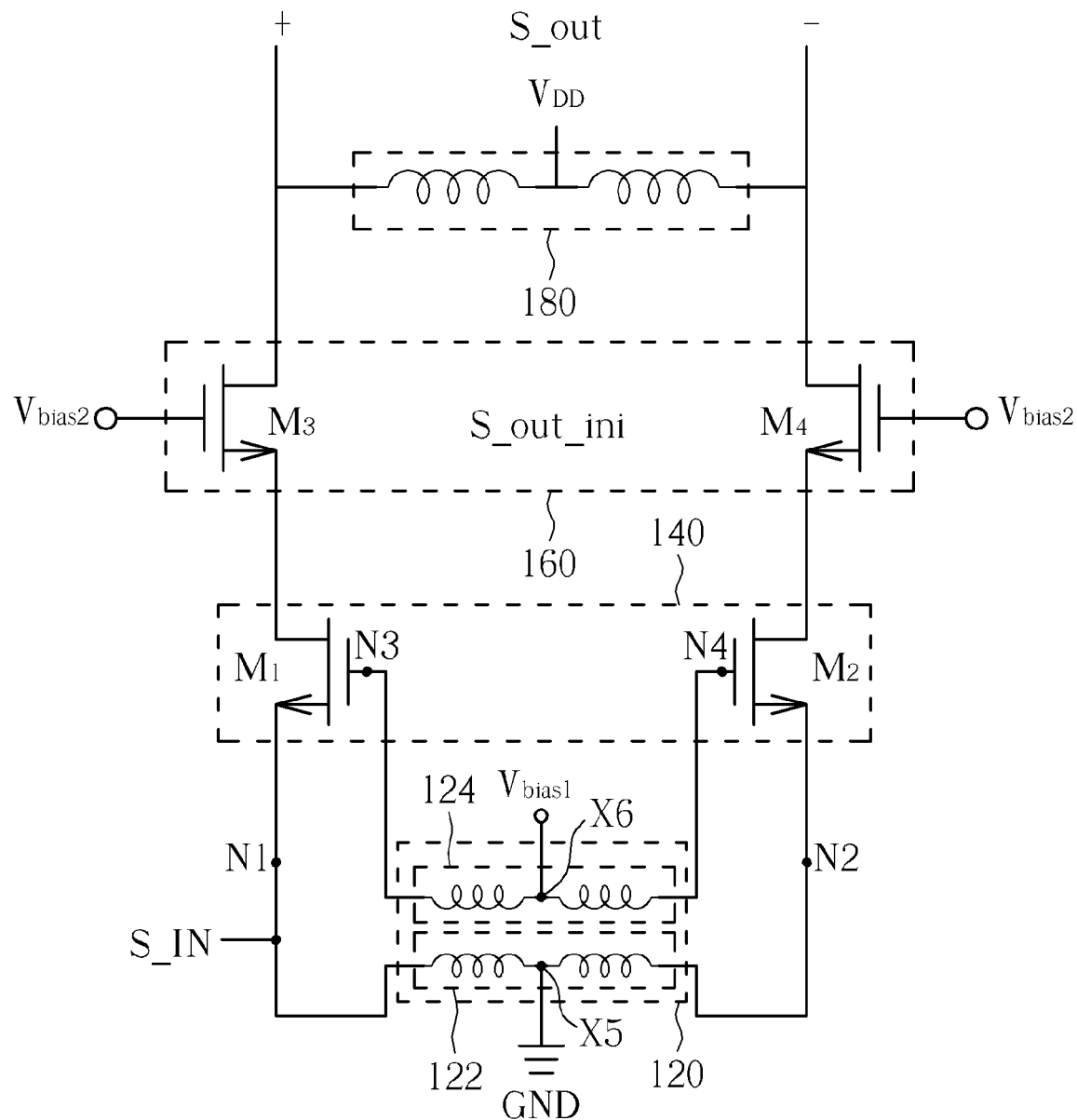
FIG. 1 is a circuit diagram illustrating an embodiment of the amplifier of the present invention.

Please refer to FIG. 1, which is a circuit diagram illustrating an embodiment of the amplifier of the present invention. As shown in FIG. 1, the amplifier 100 can apply a gain to an input signal S_in to generate an output signal S_out. The amplifier 100 includes a transformer 120 and a first stage gain circuit 140. The transformer 120 includes a primary coil 122 and a secondary coil 124. The first terminal of the primary coil 122 and the second terminal of the primary coil 122 are coupled to the first input terminal N1 and the second input terminal N2 of a first input port of the first stage gain circuit 140, respectively. Moreover, the first terminal of the secondary coil 124 and the second terminal of the secondary coil 124 are coupled to the third input terminal N3 and the fourth input terminal N4 of a second input port of the first stage gain circuit 140, respectively. When the single-ended input signal S_in is inputted to the transformer 120 through the first terminal (or the input terminal N1) of the primary coil 122, the second terminal (or the input terminal N2) of the primary coil 122 will generate a signal with a phase inverse to that of the input signal S_in based on the Lenz's law. In this way, a set of differential signals can be formed at the first input port of the first stage gain circuit 140. Moreover, the differential signals formed at two terminals of the primary coil 122 can be coupled to the third input terminal N3 and the fourth input terminal N4 of the first stage gain circuit 140 through the signal coupling provided by the transformer 120. In this way, the equivalent transconductance of the transistors M1 and M2 in the first stage gain circuit 140 will be enhanced, thus further suppressing the channel noise resulting from amplifying the set of differential signals.

In an embodiment of the present invention, the primary coil 122 further includes a tap X5 coupled to a first reference voltage such as the ground voltage GND, wherein the tap X5 may be a center tap. Besides, the secondary coil 124 also includes a tap X6 coupled to a second reference voltage such as the bias voltage Vbias1, wherein the tap X6 may be a center tap. However, the aforementioned specific connection and the connection shown in FIG. 1 are not meant to be limitations to the present invention.

Additionally, the first stage gain circuit 140 includes a first MOS transistor M1 and a second MOS transistor M2, wherein the connection of each electrode of the transistors and the transformer 120 is described as below. The control electrode (e.g., the gate) of the first MOS transistor M1 and the control electrode of the second MOS transistor M2 act as the third input terminal N3 and the fourth input terminal N4 of the second input port of the first stage gain circuit 140, respectively, and are coupled to the secondary coil 124. Besides, the first electrode (e.g., the source) of the first MOS transistor M1 and the first electrode of the second MOS transistor M2 act as the first input terminal N1 and the second input terminal N2 of the first stage gain circuit 140, respectively, and are coupled to the primary coil 122. The channel noise is suppressed through the connection mentioned above. Hence, the first stage gain circuit 140 can generate an output signal S_out_ini with less noise or no noise.

In an embodiment of the present invention, the amplifier 100 further includes a second stage gain circuit 160 arranged for applying a gain to the output signal S_out_ini outputted from the first stage gain circuit 140 to generate the output signal S_out to the following signal processing circuit. However, this is not meant to be a limitation to the present invention. In other embodiments of the present invention, the amplifier 100 may only include the first stage gain circuit 140, and the amplifier 100 therefore provides the output signal S_out_ini to the following signal processing circuit directly. The second stage gain circuit 160 includes a third MOS transistor M3 and a fourth MOS transistor M4. The detailed connection is shown in FIG. 1. The electrodes of the third MOS transistor M3 and the fourth MOS transistor M4 are coupled to a bias voltage Vbias2, respectively, wherein the bias voltage Vbias2 may be equal to or different from the bias voltage Vbias1. The second electrode (e.g., the drain) of the third MOS transistor M3 and the second electrode of the fourth MOS transistor M4 will generate the differential output signal S_out. Besides, in an embodiment of the present invention, the second electrode of the third MOS transistor M3 and the second electrode of the fourth MOS transistor M4 may be connected to two terminals of a third coil 180 as shown in FIG. 1, wherein the third coil 180 acts as an inductive load of the amplifier 100.

Please note that, even though the MOS transistors M1, M2, M3, M4 mentioned above are all NMOS transistors; however, this is not meant to be a limitation to the present invention. In other embodiments of the present invention, the PMOS transistors or the combination of PMOS transistors and NMOS transistors may be employed to implement the first stage gain circuit 140 and the second stage gain circuit 160.

Figure 2:
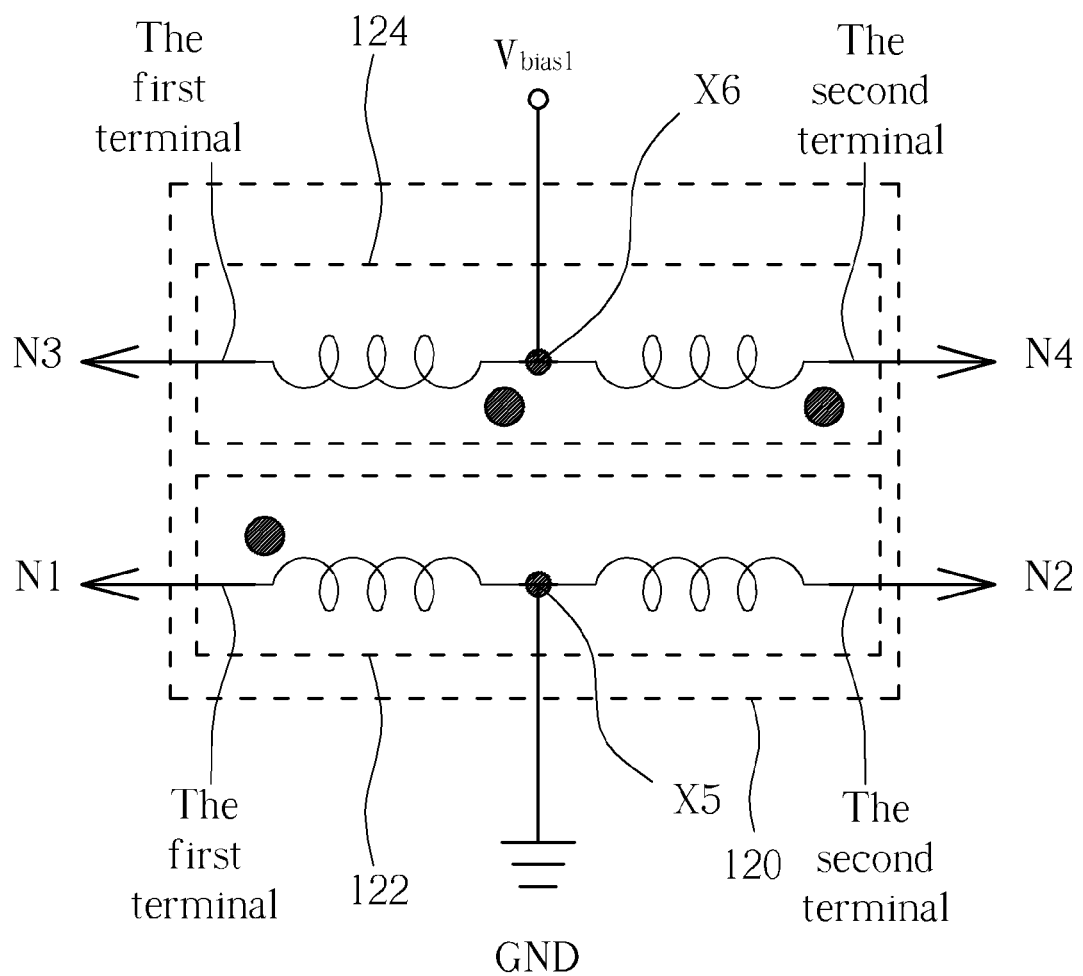
FIG. 2 is a diagram illustrating the polarity of the terminal of the transformer in the amplifier of the present invention.

In order to achieve good noise resistance performance, the primary coil 122 and the secondary coil 124 in an embodiment of the present invention have the polarity shown in FIG. 2. FIG. 2 marks the signal polarity of the coil nodes/terminals based on the dot convention. As shown in FIG. 2, the first terminal (or the node N1) of the primary coil 122 is the entry direction of the voltage/current, and the second terminal (or the node N4) of the secondary coil 124 is the exit direction of the voltage/current. That is, the first terminal (or the node N1) of the primary coil 122 and the first terminal (or the node N3) of the secondary coil 124 have different signal polarities. In this way, the primary coil 122 and the secondary coil 124 can decrease the channel noise resulting from the MOS transistors (e.g., M1, M2, M3 and M4) or decrease other noise, thereby achieving noise suppression. However, it should be noted that, the polarity arrangement shown in FIG. 2 is not the only implementation of the present invention. In other embodiments of the present invention, there are still other polarity arrangements capable of achieving noise suppression.

Figure 3:
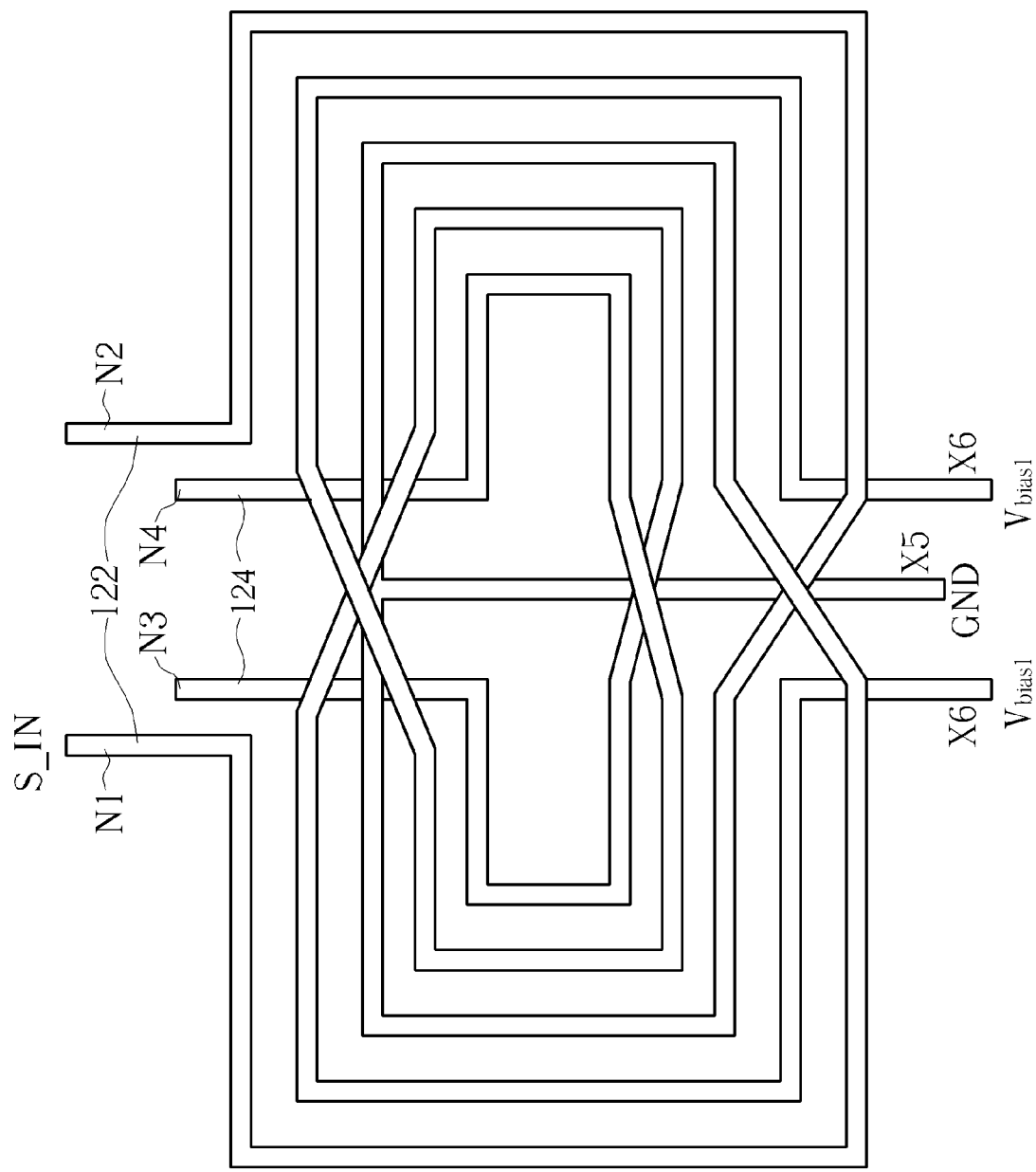
FIG. 3 is a diagram illustrating an exemplary winding embodiment of the transformer in the amplifier of the present invention.

Regarding the possible winding manner of the transformer 120 in the circuit layout, please refer to FIG. 3. As shown in FIG. 3, the two terminals of the primary coil 122 are coupled to the first input terminal N1 and the second terminal N2 of the first stage gain circuit 140, respectively, and the two terminals of the secondary coil 124 are coupled to the third input terminal N3 and the fourth input terminal N4 of the first stage gain circuit 140, respectively. Moreover, the tap X5 of the primary coil 122 is coupled to the ground voltage GND, and the tap X6 of the secondary coil 124 is coupled to the biasing voltage Vbias1. Besides, the windings of the primary coil 122 and the secondary coil 124 are composed of the conductive routing traces shown in FIG. 3. Please note that the winding manner shown in FIG. 3 is not the only winding manner of the transformer 120 of the present invention. Actually, any other winding manner capable of achieving the same effect possessed by the transformer 120 falls within the scope of the present invention.

The "an embodiment" mentioned above means that the specific feature, structure or characteristic described for the embodiment is included at least one implementation of the present invention. In other words, the "an embodiment" mentioned indifferent paragraphs does not necessarily mean the same embodiment. Therefore, although different structural features or steps are mentioned in the description of different embodiments, these features may be implemented in the same embodiment through proper modifications.

Figure 4:
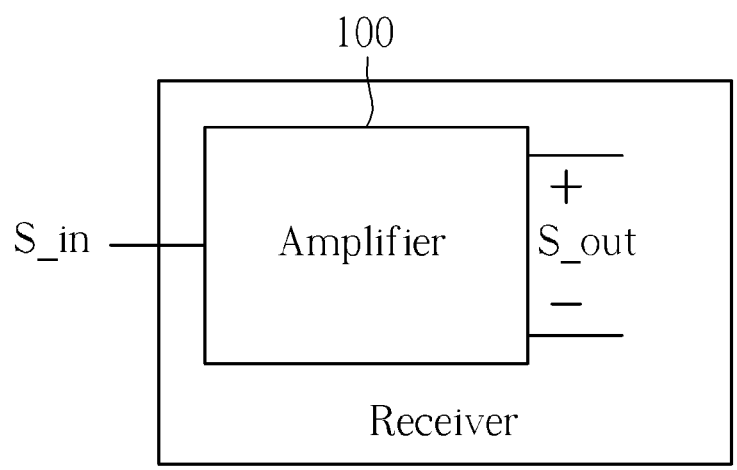
FIG. 4 is a diagram illustrating an exemplary of the amplifier of the present invention disposed in a receiver.

In practice, the amplifier 100 may be employed in a wireless receiver to act as a low noise amplifier circuit in the receiver, as illustrated by FIG. 4. Generally speaking, the low noise amplifier of the receiver usually requires the balun transformer to perform conversion between a single-ended input signal and a differential input signal because the wireless communication signal received by the antenna is often a single-ended signal. Besides, the low noise amplifier may need an inductive element to provide a high input impedance, wherein the inductive element is often disposed between the source of the transistor and the ground. Because the inductive element generally occupies considerable space of the circuit layout, such architecture often has a large circuit area. The present invention performs the conversion between a single-ended input signal and a differential input signal through the primary coil 122 of the balun transformer, and also provides the high input impedance to the amplifier 100 through the primary coil 122. Therefore, the circuit area of the amplifier 100 can be maintained at an ideal size. Besides, the secondary coil 124 of the transformer 120 of the present invention is connected to gates of the transistors (e.g., M1, and M2) in the first stage gain circuit 140. In this way, the noise can be eliminated through the signal coupling between the primary coil and the secondary coil, and a low noise amplifier with good noise performance can be implemented in a limited circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An amplifier, comprising:
   a transformer, including a primary coil and a secondary coil, wherein the primary coil is utilized for receiving an input signal; and
   a first stage gain circuit, including a first input port, wherein the first input port is coupled to the primary coil, and the first stage gain circuit is utilized for applying a gain to the input signal to generate a first output;
   wherein the first stage gain circuit comprises a first transistor and a second transistor, and each of the first transistor and the second transistor includes a control electrode, a first electrode and a second electrode; and the first input port comprises:
      a first input terminal, coupled to a first terminal of the primary coil; and
      a second input terminal, coupled to a second terminal of the primary coil;

wherein the first electrode of the first transistor and the first electrode of the second transistor serve as the first input terminal and the second input terminal, respectively.

2. The amplifier of claim 1, wherein the first stage gain circuit further includes a second input port, and the second input port comprises:
- a third input terminal, coupled to a first terminal of the secondary coil; and
- a fourth input terminal, coupled to a second terminal of the secondary coil;

wherein the control electrode of the first transistor and the control electrode of the second transistor serve as the third input terminal and the fourth input terminal, respectively.

3. The amplifier of claim 2, wherein a polarity of the first terminal of the primary coil is different from a polarity of the first terminal of the secondary coil.

4. The amplifier of claim 1, wherein the transformer is a balun transformer.

5. The amplifier of claim 1, wherein the primary coil includes a tap terminal coupled to a first reference voltage level, and the secondary coil includes a tap terminal coupled to a second reference voltage level.

6. The amplifier of claim 1, further comprising:
- a second stage gain circuit, coupled to the first stage gain circuit, the second stage gain circuit arranged for receiving the first output and generating a second output.

7. The amplifier of claim 6, further comprising:
- a third coil, coupled to the second stage gain circuit, the third coil arranged for acting as an inductive load.

8. The amplifier of claim 1, wherein the amplifier is disposed in a receiver.

* * * * *